United States Patent [19]

Krug et al.

[11] Patent Number: 5,047,162

[45] Date of Patent: Sep. 10, 1991

[54] PIEZOELECTRIC COMPOSITE MATERIALS AND METHOD OF MAKING

[75] Inventors: William P. Krug, Hoffman Estates, Ill.; Meredith A. Aronson, Drexel Hill, Pa.

[73] Assignee: Martin Marietta Corporation, Bethesda, Md.

[21] Appl. No.: 372,141

[22] Filed: Jun. 26, 1989

Related U.S. Application Data

[62] Division of Ser. No. 868,856, May 30, 1986, abandoned.

[51] Int. Cl.$^5$ .......................... C04B 35/00; H01B 1/00
[52] U.S. Cl. .................................. 252/62.9; 252/500; 524/588; 29/25.35
[58] Field of Search ............................. 252/500, 62.9; 29/25.35; 524/588; 86/8, 856

[56] References Cited

U.S. PATENT DOCUMENTS

| | | | |
|---|---|---|---|
| 2,420,864 | 5/1947 | Chilowsky | 171/327 |
| 4,407,054 | 10/1983 | Zipfel, Jr. | 29/25.35 |
| 4,595,515 | 6/1986 | Wakino et al. | 252/500 |

OTHER PUBLICATIONS

William P. Krug, "Orientation in Piezoelectric Tartaric Acid Composites", *Japanese Journal of Applied Physics*, pp. 304-305, 1985.

James M. Powers, "Piezoelectric Polymer—An Emerging Hydrophone Technology".

*Primary Examiner*—Josephine Barr
*Attorney, Agent, or Firm*—Gay Chin

[57] ABSTRACT

A piezoelectric composite material having increased sensitivity and stability with time is described. The composite includes a volume fraction of from 20 to 60 percent of piezoelectric crystals having a size distribution of from 1 to 300 microns dispersed in a polymer matrix. The composite matrix is characterized by a shear modulus of at least 50 psi.

18 Claims, 4 Drawing Sheets

EFFECT OF MEDIUM AND TEMPERATURE UPON
RESPONSE OF TARTARIC ACID COMPOSITES

FIG. 1 — Effect of medium and temperature upon response of tartaric acid composites SENSITIVITY VS PHASE ANGLE OF TARTARIC ACID COMPOSITES
SUBMERSED IN 80°C SILICONE FLUID FOR 1 MONTH

5,047,162

PIEZOELECTRIC COMPOSITE MATERIALS AND METHOD OF MAKING

This is a divisional of copending application Ser. No. 868,856, filed on May 30, 1986, now abandoned.

BACKGROUND OF THE INVENTION

This invention relates to piezoelectric composite materials having improved sensitivity for use as transducers and a method of making.

Piezoelectric materials develop a voltage when a pressure or stress is applied to them. The materials are used to fabricate pressure transducers for applications such as microphones and keyboards. Certain types of piezoelectric materials have been considered for use in underwater microphones, hydrophones, because of their substantially hydrostatic response.

Present hydrophones use pressure compensated ceramic lead zirconium titanate (PZT) cylinders. While pressure compensated PZT hydrophones offer substantially pressure independent response, such hydrophones are brittle and costly to fabricate for passive sonar applications. Uncompensated PZT discs have too low a voltage output in response to hydrostatic pressure to be useful.

PZT composite materials, i.e. PZT crystals dispersed in a polymer matrix, are flexible but have only moderately high voltage output in response to hydrostatic pressure. Polyvinylidene difluoride ($PVF_2$) is a potentially useful hydrophone sensor material. However $PVF_2$ is costly to manufacture and limited in thicknesses available. This is a severe limitation for hydrostatic sensor materials since their voltage output in response to sound increases linearly with thickness.

U.S. Pat. No. 2,420,864 to Chilowsky describes a class of piezoelectric plastic materials. In this patent, particles of piezoelectric materials such as tourmaline and tartaric acid are suspended in a polymer matrix. The particles of these piezoelectric materials obtain an electric dipole when a hydrostatic pressure is applied. The orientation of the particles in the polymer matrix is accomplished by applying an electric field simultaneously with pressure, producing a poled piezoelectric composite material. However, composites made according to prior art methods exhibiting substantial hydrostatic response, do not have sufficient stability over time.

U.S. Pat. 4,407,054 to Zipfel describes a method of making flexible piezoelectric composites exhibiting a stable hydrostatic response at room temperature over time. Stable response is achieved by choosing a polymer having a shear modulus of less than 20 psi. While Zipfel's method improves the stability of the piezoelectric composite, the sensitivity of the composite is not comparable to that of the pressure compensated PZT sensors. For piezoelectric composites, sensitivity is proportional to the hydrostatic voltage constant. Present piezoelectric composites achieve a hydrostatic voltage constant which is substantially less than that of the single crystal alone.

Therefore, it is an object of the present invention to provide a piezoelectric composite material having improved hydrostatic voltage constant.

It is another object of the present invention to provide a piezoelectric composite material that is stable over time.

It is also an object of the present invention to provide a piezoelectric composite having an improved hydrostatic sensitivity.

It is yet another object of the present invention to provide a method of fabricating a piezoelectric composite material having improved hydrostatic voltage constant and sensitivity.

Additional objects, advantages, and novel features of the invention will be set forth in part in the description which follows, and in part will become apparent to those skilled in the art upon examination of the following or may be learned by practice of the invention.

SUMMARY OF THE INVENTION

To achieve the foregoing and other objects a piezoelectric composite material may comprise particles of a piezoelectric material dispersed in a polymer matrix, wherein the piezoelectric particles have a volume fraction of at least 20 percent and particle size distribution in the range of 1 micron to 300 micron; and wherein the polymer matrix has an elastic or Young's modulus of at least 150 psi. This corresponds to a shear modulus of about 50 psi. The elastic or Young's modulus for the composite is at least 5,000 psi. Shear modulus and elastic modulus are related according to the following relationship:

$$G = \frac{E}{2(1 + v)}$$

Where G = Shear Modulus, E = Young's Modulus, and v = Poisson's ratio = 0.5 for ideal rubber.

The piezoelectric composite material may be fabricated according to the following method comprising the steps of: dispersing a quantity of particles of a piezoelectric material in a prepolymer mixture containing a plasticizer to form a composite; removing plasticizer from the composite; wherein the composite contains at least 50 volume percent of piezoelectric particles having a size distribution in the range of micron to 300 micron. A piezoelectric composite material according to the present invention is stable to at least 80 degrees Celsius over a period of months.

DESCRIPTION OF THE DRAWINGS

The invention is illustrated in the accompanying drawings wherein.

DETAILED DESCRIPTION OF THE INVENTION

Figure 1:
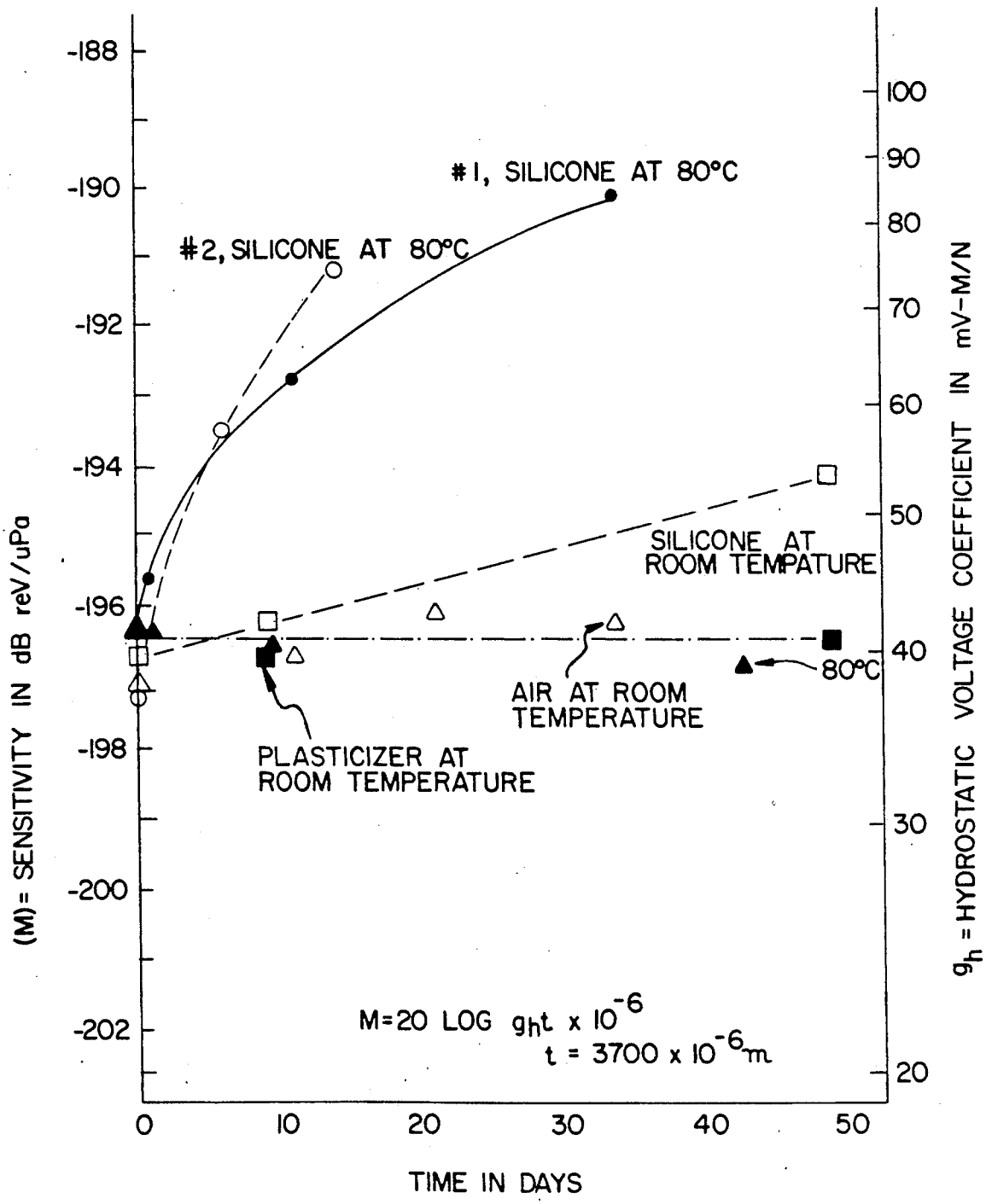
FIG. 1 shows the effect of medium and temperature upon response of a tartaric acid composite.

To fabricate a piezoelectric composite material according to the present invention, a plasticized, medium of high molecular weight (of the order of thousands) urethane prepolymer is the matrix material of choice. A prepolymer mixture with a viscosity less than 10,000 centipose facilitates the proper polarization and orientation of the piezoelectric crystals. The resistance and capacitance of the crystal-prepolymer-plasticizer-catalyst mixture are selected to achieve a maximum RC time constant (of the order of one second). This RC time constant is a measure of the time span during which hydrostatic pressure induced dipoles at the crystal surface are compensated by charges migrating through the mixture under the influence of the applied electric poling field. The electric field exerts an effective orienting torque upon the crystals only during the lifetime of the uncompensated dipoles. Presently, crystals are preferably oriented at a frequency of 0.1 Hz to 1 Hz. This equals about 1/RC for the liquid composite mixture. To minimize the effective poling frequency, a prepolymer mixture and plasticizer with the highest resistivity and dielectric constant is desirable. Typical poling electric fields and pressures can be found in Zipfel. After the crystals are oriented by the poling process, plasticizer is removed. This has the unexpected benefit of doubling the sensitivity of the cured piezoelectric composite material.

In general, piezoelectric crystals having high hydrostatic piezoelectric voltage constants may be used in the composite. For example, tartaric acid composites based upon crystals dispersed in an initially plasticized polybutadiene based polyurethane prepolymer according to the invention resulted in a ten-fold improvement in hydrostatic voltage coefficient over previous tartaric acid composites.

Numerous mono- and di- saccharides, which are low in molecular weight and also perfectly crystalline, can also be used. Several common saccharides have a monoclinic $C_2$ symmetry, possess a polar axis, and therefore generate a voltage in response to applied hydrostatic pressure. These crystals were dispersed in polyurethane matrices and poled. The relative extent of polar axes and crystal orientation as determined by x-ray measurements was proprotional to sensitivity. Hydrostatic voltage constants, $g_h$'s for these composites were comparable to the highly piezoelectric polymer polyvinylidene difluoride, $PVF_2$ Hydroxyl and carboxylate containing compounds that do not substantially change hydration level or crystal phase in the desired temperature range of application and which are members of the crystal class 1, 2, 3, 4, 6, m, 2mm, 4mm, 3m, and 6mm may be used.

EXAMPLE I

A transducer using a piezoelectric composite according to the invention was fabricated as follows. The polymer matrix material was a urethane prepolymer under the tradename Hexcel's Hexagel 195 RE, which contains up to 60 percent plasticizer by weight. Commercially available tartaric acid was pin disc milled to an average crystal size of 100 micron. Crystals ranged from micron to 300 micron in size. The capacity of the pin disc mill was tons per hour and the yield of usable crystals was 100 percent. 50 volume per cent of milled tartaric acid crystals was dispersed into the polyol part B (or polybutadien-diol) and isocyanate part A prepolymer mixture. The volume fraction may range from 20 to 60 percent. The mixture was degassed under mechanical pump vacuum approximately 30 minutes. The liquid composite mixture was injected into a pressure cell between stainless steel cell plates that were electrically insulated from each other by a 3700 micron thick cell spacer. Petrarch's Glassclad SE solid silicone coating was used as a release agent. It did not lower the RC time constant for the composite mixture. A square wave of about 50 psi to 1200 psi pressure and ±600 V was synchronously applied across the cell at 0.1 Hz for two hours. The cell was inverted and the process continued for two more hours. The cured and poled tartaric acid composite material was removed from the cell on the following day. The composite was then submersed in 10 cps Dow Corning DC-200 silicone fluid for two days at 80-100 degrees Celsius. Sensitivity and mass loss were monitored to determine the optimum treatment time. All sensitivities were measured in an acoustic chamber previously used to calibrate ceramic hydrophones. During the treatment process, the sensitivity increased 100 to 150%, the capacitance decreased by 13 to 20% and the mass decreased 21 to 23%. Samples were formed with electrodes by priming the surface and applying either elastomeric silver filled paint or thin copper foil. The sensitivity of the treated sample was essentially stable over time at temperatures up to at least 80 degrees Celsius. Catalysts can be added to decrease the polymer mixture cure time and coatings can be applied to protect the piezoelectric composite from harsh operating environments. The Young's or elastic modulus of the polymer matrix prior to treatment was 100±80 psi at 20 Hz to 100 Hz. Treatment increased its elastic modulus to 500±300 psi. The composite modulus was increased from 3700 psi to about 30000 psi.

EXAMPLE II

A transducer using a second piezoelectric composite according to the invention was fabricated as follows:

The polymer matrix material was a polyurethane prepolymer under the tradename Hexcel Hexagel 195 RE, which contains up to 60 percent plasticizer by weight. Commercially available lactose monohydrate with an average crystal size below 5 micron was used. Fifty volume percent of lactose hydrate crystals were dispersed into the plasticized, polyol part B or polybutadiene-diol and isocyanate part A prepolymer mixture. The mixture was cured and poled in a cell according to the previous example. The composite sensitivity measured using an acoustic calibration chamber was −197 dB reV/uPa. The composite was submersed in 10 cps Dow Corning DC-200 silicone fluid for four days at 80 degrees C. Sensitivity and mass loss were monitored to determine the optimum treatment time. During the treatment process, the sensitivity increased 70% to −192.3 dB reV/uPa and the capacitance decreased 20%. The sample was electroded according to the previous example prior to measurements.

The Young's or elastic modulus of the polymer matrix prior to treatment was 100±80 psi at 20 Hz to 100 Hz. Treatment increased the elastic modulus of the polymer matrix to 500±300 psi. The Young's or elastic modulus of the lactose composite prior to treatment was 940±300 psi at 20 Hz to 100 Hz. Treatment increased the elastic modulus to 14000±3000 psi.

Figure 2:
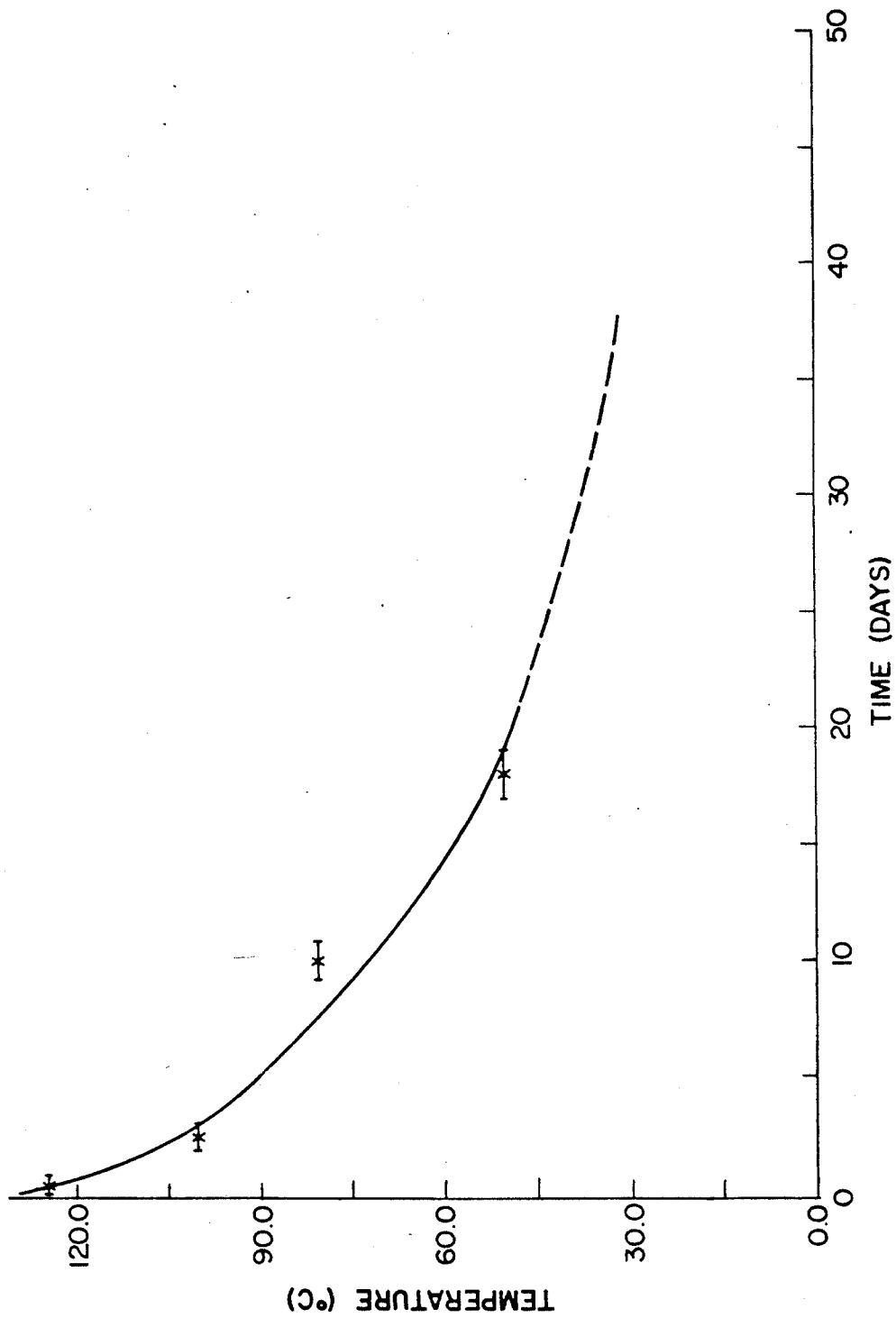
FIG. 2 shows the effect of temperature on treatment time.
Figure 3:
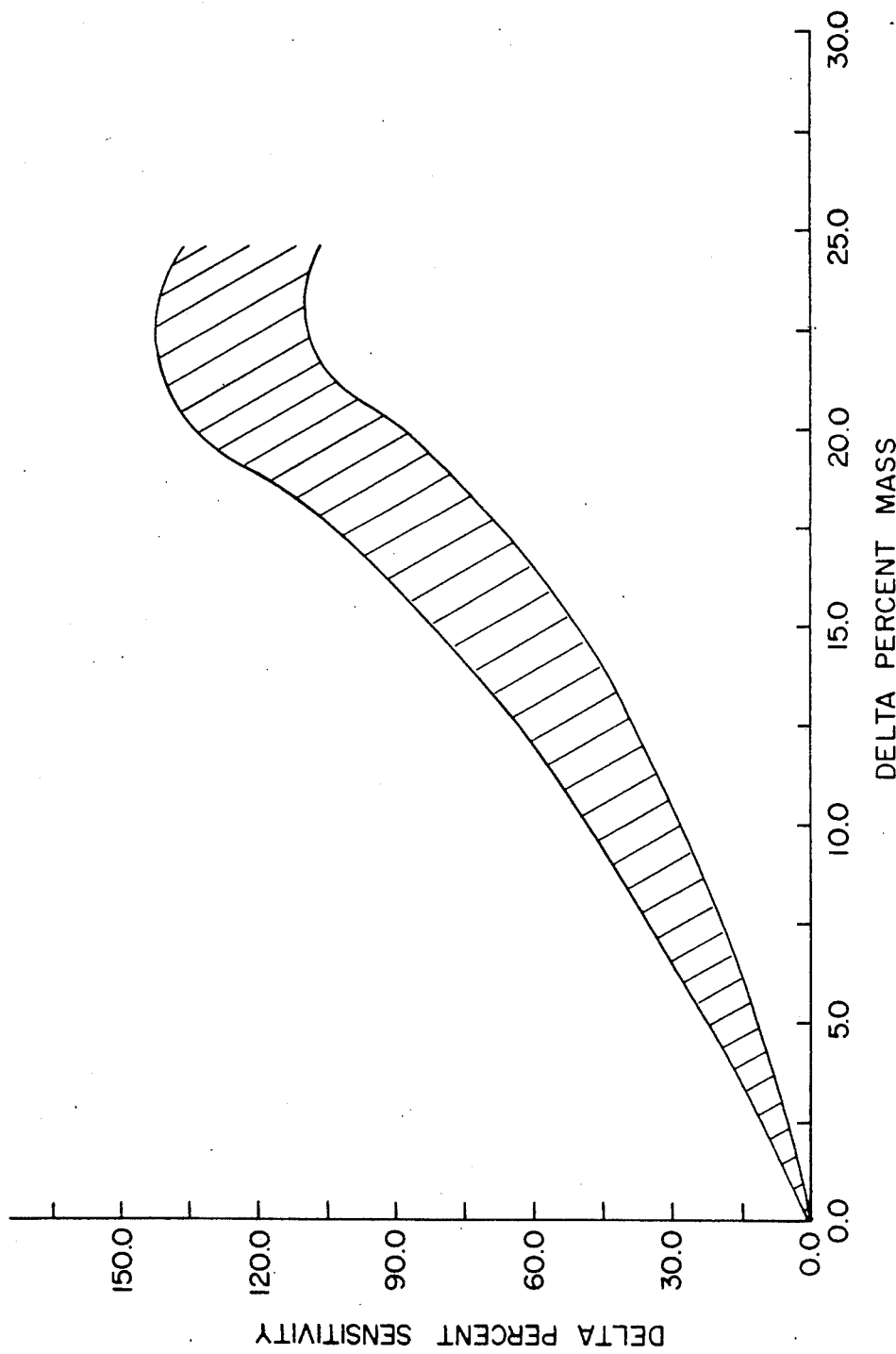
FIG. 3 shows sensitivity -vs- percent mass loss for tartaric acid composites submersed in silicone.

A tartaric acid composite disc of Example I was submersed in silicone oil fluid at several temperatures between room temperature and 100 degrees Celsius. At all temperatures, the sensitivity of the material increased with time. The rate at which the sensitivity increased was directly related to the temperature, the medium as shown in FIGS. 1 & 2, and the exposed surface area of the composite. Matrix degradation and other effects preclude the use of treatment temperatures higher than 100 degrees Celsius. During the treatment period, the composite material also decreased in mass. The untreated composite mixture contained 21% plasticizer by weight. The treated piezoelectric composite reached maximum sensitivity after a mass loss of 21-23%. (FIG. 3). This strongly suggests that the plasticizer was wrung from the shrinking composite. A one to two orders of magnitude increase in composite stiffness or elastic modulus after the silicone treatment is also consistent with plasticizer loss from the material. The driving force for this process is provided by the interaction between the silicone fluid and the polyurethane. In general, for a plasticized elastic polymer matrix, the treatment medium is chosen to decrease the volume of the polymer. This drives the non-volatile plasticizer from the polymer matrix.

Figure 4:
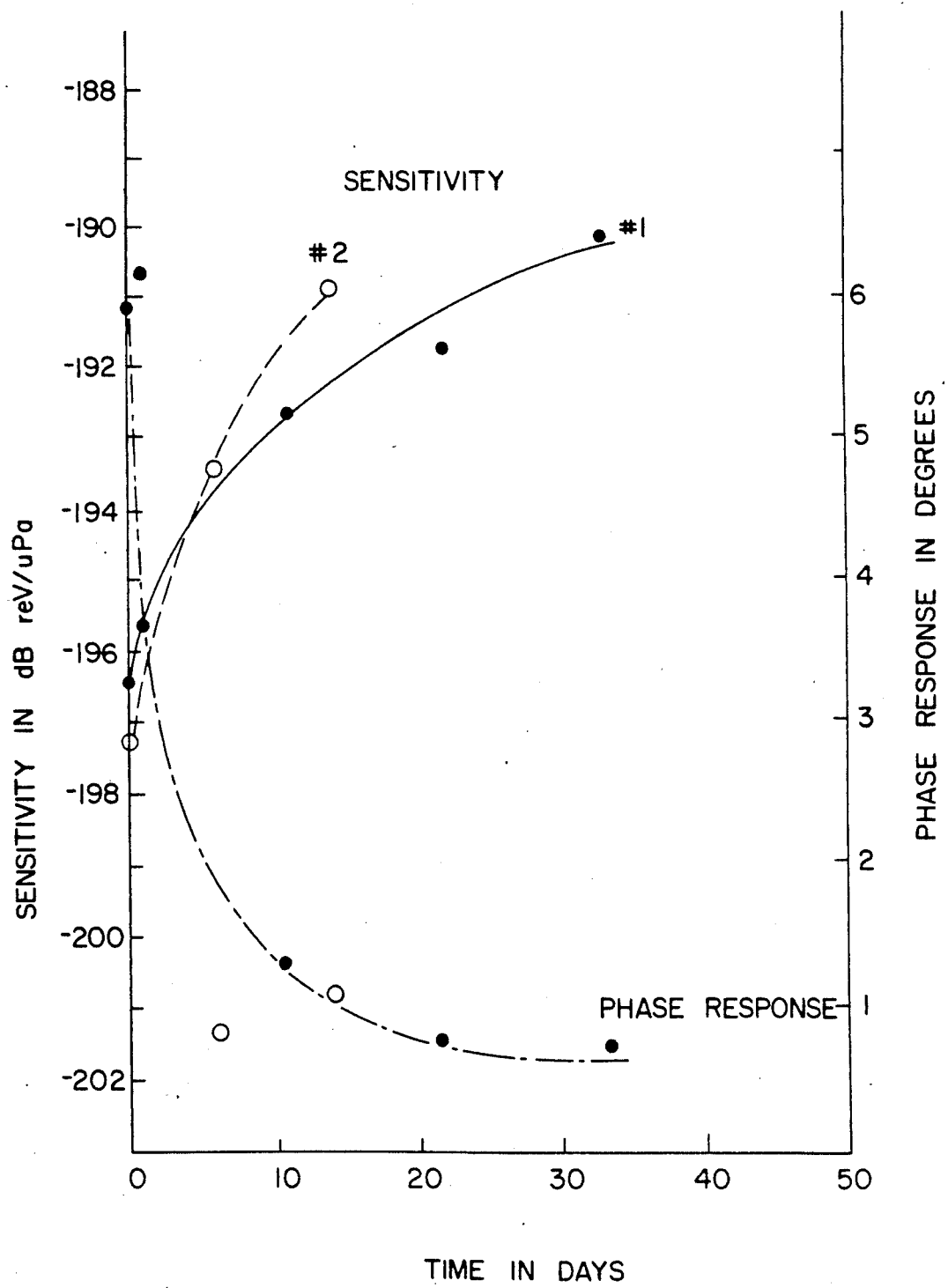
FIG. 4 shows sensitivity -vs- phase angle of tartaric acid composites.

The observed increase in sensitivity with loss of plasticizer from the composite matrix is due to an increase in the efficiency in which mechanical energy, pressure, is converted to electrical energy, voltage. The liquid plasticizer or low molecular weight oligomer in the prior art polymer may function as a viscous damping medium. To support this theory, we have shown that the measured phase response of the sensitivity with respect to a reference ceramic transducer decreases with an increase in composite sensitivity (FIG. 4). The phase angle, $\delta$, measured is the extent that the electrical response differs from the applied acoustic pressure in phase. If the electrical response is directly in phase with the strain at the crystal surfaces, then we are indirectly measuring tan $\delta$, the ratio of the mechanical loss modulus to the storage modulus for the material. During silicone treatments, $\delta$ decreases from 6 degrees to less than one degree and tan $\delta$ decreases by a factor of six. The mechanical to electrical energy conversion efficiency increases several times and the sensitivity more than doubles.

Polymeric materials are mechanically viscoelastic. By removing liquid plasticizer, we removed a viscous damping medium from the composite. Mechanical measurements of tan $\delta$ suggest that pressure propagates through the plasticized composite less efficiently. Low molecular weight oligomers may also be highly viscous with a mechanical $\delta >> 0$ degrees. Pressure propagating through the material may be partially dissipated or lost as heat. This property may limit the sensitivity of the prior art composites to a value lower than that obtained using a lightly crosslinked high molecular weight, highly elastic material with $\delta > 0$ degrees. (FIG. 4).

We claim:

1. A method of making a composite piezoelectric material comprising the steps of:
   (a) dispersing a quantity of particles of a piezoelectric material in a prepolymer mixture containing up to 60 wt. plasticizer to form a composite;
   (b) poling the composite;
   (c) curing the composite to cause polymerization; and
   (d) essentially removing the plasticizer from the composite in an amount of 20-25 wt. % of the composite by submersing the composite in silicone fluid which reacts with the polymer;
   wherein the composite contains at least 20 volume percent of piezoelectric particles having a size distribution in the range of 1-300 microns.

2. A method of making a composite piezoelectric material as defined inn claim 1, wherein the composite piezoelectric material is degassed prior to poling.

3. A method of making a composite piezoelectric material as defined inn claim 1, wherein the prepolymer mixture comprises a medium to high molecular weight polyurethane.

4. A method of making a composite piezoelectric material as defined in claim 1, wherein the prepolymer mixture comprises a polybutadiene based polyurethane.

5. A method of making a composite piezoelectric material as defined in claim 1, wherein the volume percent of the piezoelectric particles is in the range of 20-60 percent.

6. A method of making a composite piezoelectric material as defined in claim 11, wherein the volume percent of the piezoelectric particles is approximately 50 percent.

7. A composite piezoelectric material including a polymer matrix of a first mass, made from a prepolymer and up to 60% wt. % plasticizer, in which is dispersed at least 20 percent by weight of a plurality of piezoelectric particles selected from the group consisting of tartaric acid, mono-saccharides, disaccharides and carboxylic salts, each of said particles having a size of 1 to 300 microns, and which is poled and cured to polymerization, the improvement comprising:
   the composite having the plasticizer essentially removed in an amount of 20-25 wt. % of the composite by reacting the polymer with silicone fluid, such that the polymer matrix is reduced to a second, lesser mass and the composite exhibits a hydrostatic piezoelectric response which is substantially stable over time and a high hydrosotatic voltage constant.

8. The composite as recited in claim 7, wherein the matrix exhibits a Young's modulus of at least 150 psi.

9. The composite as recited in claim 7, wherein said polymer matrix exhibits a Young's modulus of at least 500 psi.

10. The composite as recited in claim 7, wherein the piezoelectric particles are members of the crystal classes 1, 2, 3, 4, 6, m, 2mm, 4mm, 3m, and 6mm.

11. The composite as recited in claim 7, wherein the prepolymer is selected from the group of medium to high molecular weight polyurethanes.

12. The composite as recited in claim 7, wherein the prepolymer is a polybutadiene-based polyurethane.

13. The compoosite as recited in claim 7, wherein the volume percent of piezoelectric particles is in the range of 22 to 60 percent.

14. The compoosite as recited in claum 7, wherein the volume percent of piezoelectric particles is approximately 50 percent.

15. The composite as recited in claim 7, wherein said composite exhibits a Young's modulus of at least 5000 psi.

16. The composite as recited in claim 7, wherein said composite exhibits a Young's modulus of at least 15,000 psi.

17. The composite as recited in claim 7, wherein said composite exhibits a Young's modulus of at least 30,000 psi.

18. The composite as recited in claim 7, wherein the response is in the range of $-192.3$ to $-190$ dB reV-/uPa.

* * * * *